US005223790A

United States Patent [19]

Baran et al.

[11] Patent Number: 5,223,790

[45] Date of Patent: Jun. 29, 1993

[54] CURRENT SENSOR USING CURRENT TRANSFORMER WITH SINTERED PRIMARY

[75] Inventors: Paul Baran, Atherton; Ronald S. Palmer, Sunnyvale, both of Calif.

[73] Assignee: Metricom, Inc., Los Gatos, Calif.

[21] Appl. No.: 698,508

[22] Filed: May 10, 1991

[51] Int. Cl.[5] ........................ G01R 1/20; G01R 19/00

[52] U.S. Cl. ................................ 324/127; 324/117 R; 324/126; 338/49

[58] Field of Search ............. 324/117 R, 127; 338/49; 29/614, 615, 851, 875

[56] References Cited

U.S. PATENT DOCUMENTS 3,726,006 4/1973 Muckelroy ............................ 29/846
3,828,428 8/1974 Wayland ............................... 29/875
3,833,407 9/1974 Schebalin ............................. 338/49
3,922,777 12/1975 Weitze et al. .......................... 29/851
3,932,935 1/1976 Harmsen et al. ....................... 29/875
3,934,198 1/1976 Milkovic .
4,182,982 1/1980 Wolf et al. ........................... 324/127
4,240,059 12/1980 Wolf et al. ............................ 338/49
4,309,655 1/1982 Lienhard et al. ............... 324/117 R
4,390,839 6/1983 Houston .
4,475,099 10/1984 Praria .................................... 338/49
4,496,932 1/1985 Halder ................................ 324/127
4,506,214 3/1985 Lienhard et al. ................... 324/127
4,556,843 12/1985 Milkovic et al. .
4,682,102 7/1987 Milkovic .
4,721,840 1/1988 Fielding ............................. 219/110
4,754,219 6/1988 Milkovic .
4,786,863 11/1988 Milkovic .
4,794,326 12/1988 Friedl .................................... 338/49
4,811,477 3/1989 Sylvester, Jr. et al. ............. 336/206
4,835,463 5/1989 Baran et al. ......................... 324/127
4,939,451 7/1990 Baran et al. ......................... 324/127
4,980,794 12/1990 Engel ................................. 324/127

*Primary Examiner*—Vinh Nguyen
*Attorney, Agent, or Firm*—Townsend and Townsend Khourie and Crew

[57] ABSTRACT

An isothermal current shunt device with excellent temperature coefficient of resistivity characteristics stability for use in a power measuring circuit having a wide temperature and dynamic range and particularly for customers of electric utility companies, and it includes a first arm having a first flange portion, a second arm having a second flange portion, and a bridge means coupling the first arm to the second arm wherein the bridge means is a monolithic sintered powdered-metal piece having a block portion and a loop portion. The block portion has a first face juxtaposed to and electrically coupled to the first flange portion of the first arm and a second opposing face juxtaposed to and electrically coupled to the second flange portion of the second arm. This configuration allows a majority of electrical current to conduct between the first arm and the second arm. The loop portion is outside the first face and the second face of the block portion and conducts a minority of current. A notch is formed in the block portion where the shunt portion meets the block portion and is used to control the current densities in both the block portion and the loop portion. The central axis of the loop is disposed orthogonal to the axis between the first flange portion and the second flange portion. The loop portion serves as a primary in a current transformer with a secondary mounted on a core in the loop. The transformer further includes a magnetic shield mounted on the loop to shield the transformer from stray magnetic fields that would otherwise distort current measurements obtained by use of the transformer.

13 Claims, 4 Drawing Sheets

CURRENT SENSOR USING CURRENT TRANSFORMER WITH SINTERED PRIMARY

BACKGROUND OF THE INVENTION

The present invention relates to a.c. power measurement in general, and more specifically, to a device for measuring power by sensing a.c. currents accurately over a wide temperature range and wide dynamic range of applied currents.

Power measurement technology has developed three main approaches to measuring current: current transformers, shunts and Hall effect and like devices. Current modern electronic electric utility power meters must handle a very wide dynamic range from 200 Amperes down to Milliamperes and each approach has its limitations. Conventional current transformers exhibit a very limited dynamic range, since they saturate at high currents and they lose sensitivity because of limited initial permeability. Current transformers also tend to saturate with small d.c. current flow caused by half-wave rectified loads, and they exhibit non-linear response because of the magnetizing current which causes amplitude and phase shift errors of the measured currents. Since instantaneous power is the product of instantaneous voltage and instantaneous current, any phase shifts can cause errors.

Current transformers generally use a large, high quality toroid transformer for the highest accuracy. To reduce cost and size a shunt is often used.

Shunts, i.e., resistive shunt measuring devices, are desirable because of their low cost compared to current transformers but exhibit several limitations. Although measured voltage drop in a shunt is proportional to current, heating is proportional to the square of the current. Hence, shunts tend to waste power and can overheat to the point of destruction in a wide dynamic range environment. A shunt measuring circuit must be at the same potential as the shunt. This restriction makes it awkward to measure two simultaneous currents, as for example in 120/240 volt circuits where each is at a different potential.

The inability of shunts to accurately track current over a wide temperature range can be at least partially attributed to various materials used in making the shunts. Accuracies on the order of a few parts per million per °C. are required, but are not feasible as the resistive material must also be able to withstand 7,000 Amperes short circuit current without change of accuracy. One material used in shunts is Manganin. Its characteristics allow very accurate and uniform current tracking with respect to the change in temperature. However, it is very difficult to work into the elements of a transformer having a shunt. When the solid metal is shaped into a desired geometry, much of the desired current tracking capabilities are lost for unknown reasons. Another material having uniform resistivity with respect to temperature change is Coopernal. However, Coopernal, too, cannot be worked into desired shapes such as a complex bridge piece forming a shunt without losing its desired uniform resistivity and temperature stability.

Electronic sensors, such as Hall effect devices, exhibit marked temperature sensitivity and provide limited long-term stability. This is a limitation for many applications.

Therefore, what is needed is a current measuring device with improved current tracking accuracy between a shunt portion and main load portion over a wide dynamic range and wide temperature fluctuations.

SUMMARY OF THE INVENTION

According to the present invention, an isothermal current shunt device with low temperature coefficient of resistance (TCR) characteristics for use in a power measuring circuit having a wide temperature and dynamic range and particularly for customers of electric utility companies, includes a first arm having a first flange portion, a second arm having a second flange portion, and a bridge means coupling the first arm to the second arm wherein the bridge means is a single-element sintered powdered-metal piece having a block portion and a loop portion. The block portion has a first face juxtaposed to and electrically coupled to the first flange portion of the first arm and a second opposing face juxtaposed to and electrically coupled to the second flange portion of the second arm. This configuration allows a majority of electrical current to conduct between the first arm and the second arm. The loop portion is outside of the first face and the second face conducts a o minority of current. A notch is formed in the block portion where the loop portion meets the block portion which is used to control the current densities in both the block portion and the loop portion. The central axis of the loop is disposed orthogonal to the axis between the first flange portion and the second flange portion. The loop portion serves as a primary in a current transformer with a secondary mounted on a core in the loop. The transformer also includes an external magnetic shield to shield the transformer from stray magnetic fields that would otherwise distort current measurements obtained by use of the transformer.

The special sintered powdered-metal bridge piece has an extremely low TCR of 50 to 100 parts per million per degree C. Such a low TCR temperature coefficient allows the resistivity in the loop portion of the powdered-metal bridgepiece used in the current transformer to match that of the majority current carrying portion of the powdered-metal bridgepiece over a wide range of temperature from −40° C. to +85° C. and a high current carrying capacity of up to 200 Amperes.

Due to the unique composition and sintering process used in manufacturing the shunt apparatus, the block portion is coupled to the first face and the second face by percussive welds which provide a stable, uniform low resistance electrical connection between the first face and the block portion and between the second face and the block portion.

DESCRIPTION OF PREFERRED EMBODIMENTS

Figure 1:
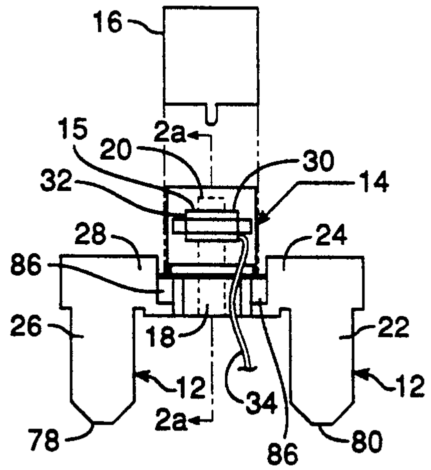
FIG. 1 is a partially-exploded view of an isothermal current sensing apparatus according to the present invention.

Referring to FIG. 1, an isothermal current sensing apparatus 10 is shown in partially-exploded view. Sensing apparatus 10 includes a mounting prong means 12, a bridge assembly 14 of sintered metal coupled to mounting prong 12, and a shield 16 for covering bridge assembly 14.

Bridge assembly 14 has a conducting block 18, having a high current carrying capability, and a conducting loop 20 which serves as a current shunt in sensing apparatus 10. Mounting prong 12, includes first arm 22 having flange 24 which mounts to a first face of block 18, and a second arm 26 having a flange 28 which mounts to a second face opposite the first face of block 18. The flanges are mounted so loop 20 is positioned with its axis transverse to the axis between the two faces of block 18. This arrangement allows current to flow from one arm to the other through bridge assembly 14 and for a portion of the current in bridge assembly 14 to be shunted through loop 20. Also, loop 20 serves as a primary ($L_P$) in a current sensing transformer. An induction coil 30, which serves as a secondary ($L_S$) in the current sensing transformer, is mounted in the center of loop 20 and held in place on a laminate core 32. Wire leads 34 are connected to induction coil 30 and core 32 and further connected to a meter, or other measuring device, to determine the current passing through sensing apparatus 10. Current sensing apparatus 10 is designed to accurately track current over a temperature range of −40° C. to +85° C. and to handle current as high as 200 Amperes.

Figure 2A:
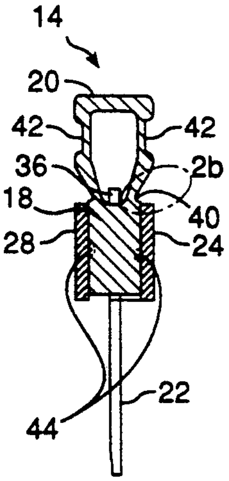
FIG. 2*a* is a cross-sectional view of a bridge assembly, including a loop portion and a block portion.
Figure 2B:
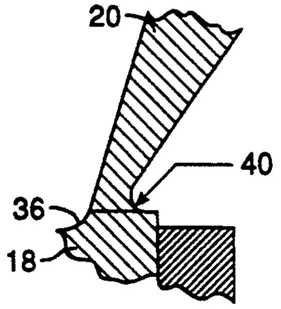
FIG. 2*b* is an enlarged view of the inner and outer radii of where the loop portion joins the block portion as seen in FIG. 2*a;*

Bridge assembly 14 is shown in cross-sectional view in FIG. 2*a*. Block 18 and loop 20 are formed from molded sintered powdered-metal of single piece construction. The geometry of the bridge assembly requires the junction region where the loop 20 meets the block 18 to have an inner radius 36 of loop 20 that extends into block 18 and shoulders 38 of block 18 that meet outer radii 40 of loop 20 as is shown in partial cut-away in FIG. 2*b*. By carefully controlling the extent of inner radius 36, the current densities in block 18 and loop 20 can be designed to conform accurately to any desired current ratio for current measuring purposes. In a specific embodiment, loop 20 has an inner surface that substantially conforms to an elongated pentagon having two parallel sides and two non-parallel sides wherein the non-parallel sides meet at inner radius 36. In addition, the outer surface of loop 20 includes two indentations 42 adjacent the inner parallel sides to receive core 32. The specifications for an actual bridge assembly 14 are provided below.

Block 18 further includes two metal plates or arms 22 and 26 that are welded unto the sides of block 18. A special welding process, namely, percussive welding, is employed. The process involves placing flanges 24 and 28 against block 18, each having a metal bead 44 that acts as a soldering agent on the face of block 18, applying sufficient pressure to hold the flanges in place, and then applying a sufficiently large current instantaneously, on the order of 16,0000 to 18,000 amps, to vaporize the metal bead into a plasma and to distribute the plasma uniformly between each face of block 18 and flanges 24 and 28, thus forming a uniform weld between the two elements. The percussive weld procedure is well known and an example thereof is found in Manning and Welch, "Percussion Welding Using Magnetic Force," *Welding Journal,* Sept. 1960.

Figure 3A:
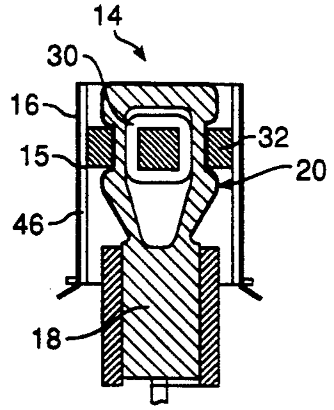
FIG. 3*a* is a cross-sectional view of a transformer using the loop of the bridge assembly in FIG. 2*a* as a primary.

Bridge assembly 14, core 32 and induction coil 30 are assembled together to form the current sensing transformer, as shown in cross-section in FIG. 3*a*. Shield 16 covers the transformer to shield it from stray electromagnetic fields, as would be present in operation at block 18. Furthermore, with the transformer being elevated above block 18, shield 16 does not saturate from the current flowing through block 18 during operation. In addition, shield 16 aids in maintaining a uniform phase response. Shield 16 includes a dielectric liner 46 to insulate the transformer. Dielectric liner 46 can be made from any suitable dielectric material, preferably from glass filled valor. Dielectric liner 46 includes two holding forks 86 in FIG. 1, which mount on flanges 24 and 28, for holding the shield and liner in place over the transformer. Shield 16 is made of a ferrous metal, such as steel, and is square with an open top. Shield 16 can also be cylindrical, sphérical, or of any other appropriate geometric shape, and have an enclosed top, if desired.

Figure 3B:
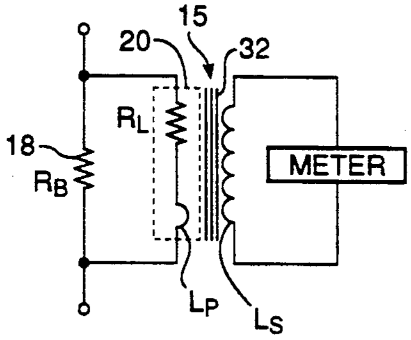
FIG. 3*b* is a schematic diagram of the transformer according to FIG. 3*a;*

The current sensing transformer circuit, formed from bridge assembly 14, core 32 and induction coil 30, is schematically shown in FIG. 3*b*. Block portion 18 acts as resistor $R_B$ which is coupled in parallel with the loop portion. Loop portion 20 forms resistor $R_L$ and an induction coil which serve as the primary $L_P$ in the transformer circuit. The loop portion is further coupled via core 32 to induction coil 30 which serves as the second primary $L_S$ in the transformer circuit.

Figure 4A:
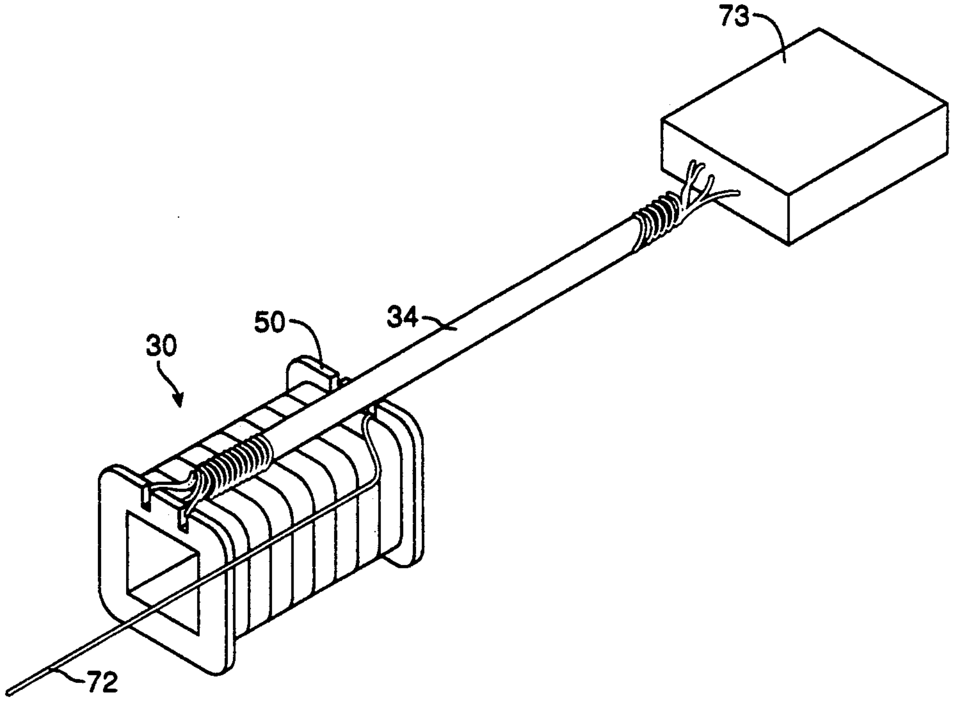
FIG. 4*a* shows the coil and bobbin assembly serving as the secondary in the transformer of FIG. 3.
Figure 4B:
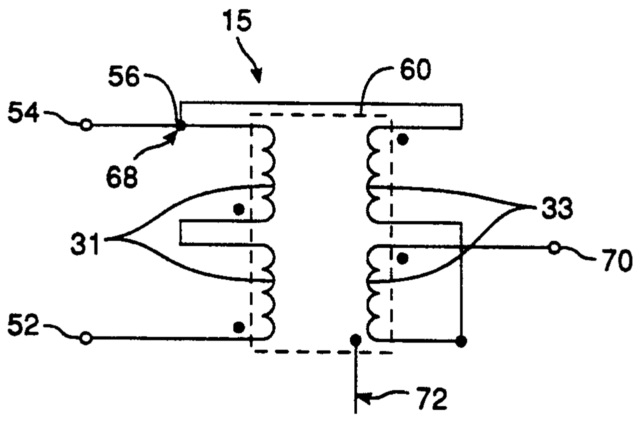
FIG. 4*b* schematic diagram of the secondary winding shown in FIG. 4*a;*
Figure 4C:
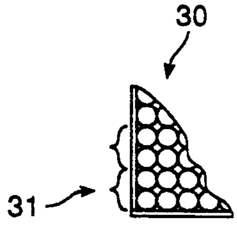
FIG. 4*c* is a cross-section view indicating quadrafilar winding of the secondary coil of FIG. 4*a;*
Figure 4D:
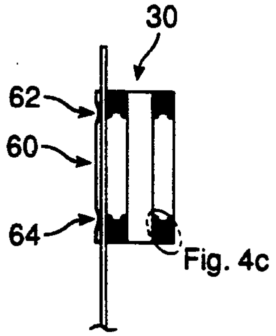
FIG. 4*d* is a cross-sectional view of the secondary of FIG. 4*a;*

Induction coil 30 is further illustrated in FIG. 4*a* and schematically illustrated in FIG. 4*b*. A bobbin 50 is used on which is wound two windings. The first winding 31 is from node 52 to node 54 and has a resistance $R_1$ of between 150 to 170 Ohms at between 20° C. to 25° C., with 160 Ohms preferred. The second winding 33 is defined from node 56 to node 70 and has a resistance $R_2$ that is within 0 Ohms to about 4 Ohms less than $R_1$. The windings between the first set of nodes 52, 54 are the secondary windings 31 while the windings between the second set of nodes 56, 70 are the resistive temperature turn (RTT) windings 33. The secondary and RTT windings are to be wound quadrafilar to match the thermal coefficient (TC) between the secondary and RTT windings (FIG. 4*c*) and to present a zero impedance load in the transformer circuit. In a specific embodiment, the secondary and RTT windings are wound as a single quadrafilar winding of 4×644 turns using #41AWG Magnetic Wire, manufactured by Dearborn. After the windings are completed, as shown in FIG. 4*d*, a Faraday shield 60 is formed around the windings. In a specific embodiment, Faraday shield 60 is formed from copper foil and mylar polyester having respective thicknesses of 0.003 inch and 0.001 inch. Below and above Faraday shield 60 are dielectric layers 62 and 64, respectively.

Attached to coil 30 are four leads that connect lead 52 (FIG. 4*b*), lead 54 and at node 68, lead 70, and lead 72 on Faraday shield 60. These leads 52, 54, 70, 72 are further connected to a current measuring circuit (not shown) via an external connector 73 for measuring the current passing through the current sensing apparatus. The leads are installed (except to lead 72) prior to forming of dielectric layers 62, 64 and Faraday shield 60.

Figure 5:
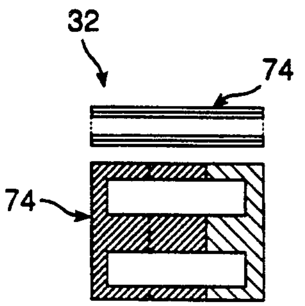
FIG. 5 includes top and side views of the magnetic core.

Core 32 is used to support coil 30 in loop 20. Core 32 is constructed of 13 paired long and short E-shaped magnetic core laminations 74, as shown in top and side views in FIG. 5. Each core lamination 74 is metal, preferably, metal of a type substantially similar to that found in Lamination Type 186-187 EE, manufactured by Magnetic Metals. Laminations 74 are secured by the use of a metallic tape (not shown), such as thick copper foil tape #P389 as manufactured by Permacel.

The current ratio between the loop and the block portions of the bridge assembly is selected preferably to approximately 1:80, but any alternative value is suitable. In summary, the invention provides in combination a thermally balanced offset shunt wherein the shunt forms a primary of a current measuring transformer, the burden of the current measuring transformer having virtually zero impedance. Such a current measuring transformer design and circuitry is taught in U.S. Pat. No. 4,939,451 and U.S. Pat. No. 4,835,463, herein incorporated by reference for all purposes. It is preferred to use the circuitry disclosed in the incorporated references with the present transformer to form the complete current measuring transformer circuit.

Figure 6:
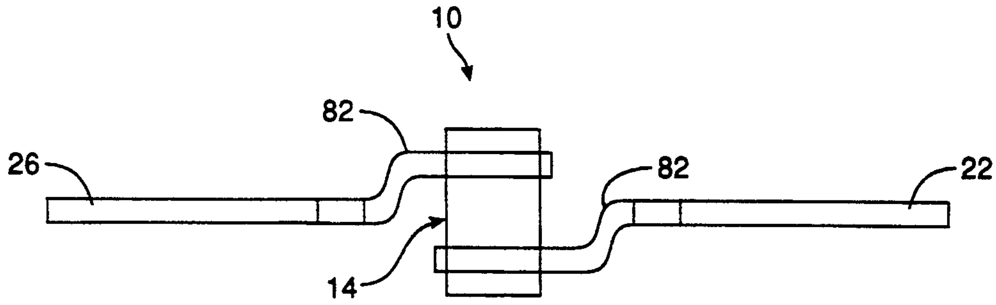
FIG. 6 is a top plan view of the isothermal current sensing apparatus of FIG. 1.

Arms 22 and 26 of mounting prong 12 (FIG. 1) are generally L-shaped and designed so that ends 78 and 80, opposite flanges 24 and 28, can insert into standard commercial and residential Kilowatt-Hour meters, as used by the electrical utility companies for monitoring electricity consumption. Both ends 78 and 80 are aligned in the same plane by a deviation 82 in each arm (FIG. 6). Both arms 22, 26 are made of a highly conductive metal, such as copper.

Once the bridge and coil assembly are completed and mounted between arms 22 and 26, the entire sensing apparatus 10 is coated with a varnish, such as Dolphon BC-352, made by the John C. Dolph Company, except for ends 78 and 80. The varnish is used to seal the exposed surfaces of the apparatus to prevent contamination.

Bridge assembly 14 is made of a specially fabricated sintered powdered-metal piece that has a TCR coefficient of 50–100 parts per million/°C. (ppm/°C). The special powdered-metal piece is used as the bridge assembly due to the limitation of other conducting metals that could be otherwise used as a bridge piece. Copper is an excellent conductor, and has a TCR on the order of 4000 ppm/°C., making it unsuitable as a bridge piece for a highly stable current sensor. Manganin and Coopernal alloys have desirably low TCRs. However, TCRs change when these alloys are formed into a desired bridge geometry. In other words, both Magnanin and Coopernal can only be fabricated in a limited number of forms, none of which is as a bridge assembly as disclosed in the present invention.

Therefore, an improved composition and method of manufacture was necessary to obtain a bridge assembly that had a desirable TCR coefficiency. In a preferred embodiment, the sintered powdered-metal piece is composed of 84% copper, 12% manganese, and 4% nickel by weight. The method of manufacturing the sintered powdered-metal piece is as follows: The powdered-metal composition is first molded under a force of 25–30 tons into a desired shape. Next, the molded powdered-metal composition is heated at a temperature sufficient to complete the sintering of the powdered-metal composition. The composition is heated from 1700° to 1800° F., with 1725° to 1750° F. preferred, for about one-half hour in a nitrogen atmosphere. It is then cooled in the nitrogen atmosphere for about five and a half hours, after which, the powdered-metal composition is dry tumbled to remove any rough edges.

The resultant structure has improved isothermal properties wherein the TCR is from 50 to 100 ppm/°C. This improved TCR allows the loop and block to have substantially the same resistivity during high current and/or high temperature loads as during low current and/or low temperature conditions. This stable resistivity between the two current paths allows for improved current tracking accuracy since the current ratio between the loop and the block remains unchanged. In other words, the improved current tracking accuracy is dependent on the differential between the temperature coefficients from one leg of the shunt to the other under local differential heating temperature. By using the heavy monolithic structure herein disclosed, both legs of the current dividing shunt can be maintained at nearly the same temperatures to allow obtainable resistive materials with a TCR of 50 to 100 ppm/°C. to be able to produce current tracking accuracies on the order of a few parts per million.

The preferred dimensions of the monolithic bridge assembly are as follows: The overall height is 1.575 inches, with a thickness of 0.38 inch. The block portion of the bridge assembly is 0.715 inch high by 0.360 inch wide by 0.38 inch thick. The loop portion has the same thickness of the block portion but is 0.86 inch high and 0.64 inch wide. Each side of the loop portion has a notch that begins at 0.24 inch from the top and extends 0.250 inch. The width of the loop between the notches is 0.540 inch. The sides of the loop then taper at a 50 degree angle with respective to the width of the top of the block portion until reaching the top of the block portion. The point at which the loop and block portions meet has a width of 0.30 inch. The opening in the loop portion is pentagon-shaped with two parallel sides 0.390 inch apart, a top side having a length of 0.390 inch and perpendicular to the parallel sides, and two non-parallel sides that taper to a radius of 0.060 inch at where the loop portion meets the block portion, extending 0.035 inch into the block portion.

Each corner of the block portion is further rounded to have a radius of R', where R'=0.020 inch. The radii of the top edges of the loop portion equal 0.060 inch. The radii of the edges formed in the notch portions are 0.030 inch.

The bridge assembly, using the special geometry and the low TCR sintered metal composition, provides a current tracking accuracy of 50–100 ppm/°C. over a temperature range of −40° C. to +85° C.

While the invention has been particularly shown and described with reference to preferred embodiments thereof, it will be understood by those skilled in the art that the foregoing and other changes in the form and details may be made therein without departing from the spirit or scope of the invention.

What is claimed is:

1. An apparatus for providing an isothermal current shunt for use in an electrical meter comprising:

a first arm having a first flange portion;

a second arm having a second flange portion; and a bridge means coupling said first arm to said second arm, said bridge means comprising a monolithic sintered powdered-metal piece having a block portion and a loop portion, said block portion having a first face juxtaposed to and electrically coupled to said first flange portion of said first arm and a second opposing face juxtaposed to and electrically coupled to said second flange portion of said second arm for conducting a majority of electrical current between said first arm and said second arm, and said loop portion forming a loop outside of a region lying between said first face and said second face for conducting a minority of current through said loop portion, a central axis of said loop being disposed parallel to said first and second faces and orthogonal to an axis between said first flange portion and said second flange portion and perpendicular to said first and second faces.

2. The apparatus according to claim 1 wherein a first end of said loop portion is disposed adjacent said first face and a second end of said loop portion is disposed adjacent said second face, and further wherein a first notch is disposed between said first face and said first end and a second notch is disposed between said second face and said second end, said first and second notches being formed to define the current density of said block portion and said loop portion.

3. The apparatus according to claim 1 wherein said block portion is coupled by percussive weld to said first flange portion and to said second flange portion to provide low resistance and uniform electrical connection between said first flange portion and said block portion and between said second flange portion and said block portion.

4. The apparatus according to claim 1 further comprising:

a transformer having a primary, a secondary, and a magnetic core, said primary being said loop portion and said secondary being mounted on said core thereby to define a current transformer.

5. The apparatus according to claim 4 further comprising a magnetic shield detachably mounted to said arms and positioned to cover said transformer.

6. The apparatus according to claim 4 wherein said secondary includes a first winding having a first impedance and a second winding having a second impedance where said first winding is wound quadrafilar with respect to said second winding.

7. A bridge apparatus for forming a shunt to measure current, said bridge apparatus comprising:

a monolithic sintered powdered metal piece having a block portion and a loop portion, said block portion having a first face and a second opposing face for conducting a majority of electrical current between said first face and said second face, and said loop portion forming a loop outside of said face and said second face for conducting a minority of current through said loop portion; and a transformer having a primary, a secondary and a magnetic core, said primary being said loop portion and said secondary being mounted on said core thereby to define a current transformer;

wherein said secondary includes a first winding having a first impedance and a second winding having a second impedance wherein said first winding is wound quadrafilar with respect to said second winding.

8. A bridge apparatus for forming a shunt to measure current, said bridge apparatus comprising:

a block portion, said block portion having a substantially rectangular shape of a given height, width and thickness, wherein said height is greater than said width and said thickness and said thickness is greater than said width, having a first face and a second opposing face for conducting a majority of electrical current between said first face and said second face, and having a notch in an end orthogonal to said first and second faces, said notch having a radius R; and a loop portion, said loop portion having an elongate pentagon-shape with a first pair of parallel sides extending to a second pair of converging sides, said pair of parallel and converging sides having a height greater than said block portion height, with said converging sides connecting to said block portion to form said notched end of said block portion, a side orthogonal to and connecting said parallel sides having a length greater than said block portion width, and a thickness substantially equal to said block portion thickness, each of said parallel sides includes a supporting notch centrally positioned on the outside edge of said parallel side, wherein said loop portion is formed outside of said first face and said second face for conducting a minority of current through said loop portion.

9. The apparatus according to claim 8 wherein said supporting notch is set to define the current densities of said block portion and said loop portion.

10. The bridge apparatus in claim 8 further comprising:

a transformer having a primary, a secondary, and a magnetic core, said primary being said loop and said secondary being mounted on said core further mounted on said supporting notches thereby to define a current transformer.

11. The apparatus according to claim 10 further comprising a magnetic shield positioned to cover said transformer.

12. The apparatus according to claim 10 wherein said secondary includes a first winding having a first impedance and a second winding having a second impedance wherein said first winding is wound quadrafilar with respect to said second winding.

13. A bridge apparatus for forming a shunt to measure current, said bridge apparatus comprising:

a monolithic sintered powdered metal piece having a block portion and a loop portion, said block portion having a first face and a second opposing face for conducting a majority of electrical current between said first face and said second face, and said loop portion forming a loop outside of said first face and said second face for conducting a minority of current through said loop portion;

wherein said sintered powdered metal piece consists essentially of copper 84%, manganese 12%, and nickel 4% weight per volume.

* * * * *